US012682972B2

(12) United States Patent
Tsai et al.

(10) Patent No.: US 12,682,972 B2
(45) Date of Patent: Jul. 14, 2026

(54) CLOCK GENERATION CIRCUITS FOR MEMORY DEVICES WITH BUILT-IN SELF TEST

(71) Applicant: Taiwan Semiconductor Manufacturing Company, Ltd., Hsinchu (TW)

(72) Inventors: Jui-Che Tsai, Hsinchu (TW); Chia-En Huang, Hsinchu (TW); Tung-Cheng Chang, Hsinchu (TW); Chun-Ying Lee, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 164 days.

(21) Appl. No.: 18/352,815

(22) Filed: Jul. 14, 2023

(65) Prior Publication Data

US 2025/0022526 A1      Jan. 16, 2025

(51) Int. Cl.
*G11C 7/22*          (2006.01)
*G11C 29/12*         (2006.01)
*G11C 29/46*         (2006.01)

(52) U.S. Cl.
CPC .... *G11C 29/12015* (2013.01); *G11C 29/1201* (2013.01); *G11C 29/46* (2013.01)

(58) Field of Classification Search
CPC .......... G11C 29/12015; G11C 29/1201; G11C 29/46
See application file for complete search history.

(56) References Cited

U.S. PATENT DOCUMENTS

| | | | |
|---|---|---|---|
| 6,236,697 B1 | 5/2001 | Fang | |
| 7,605,622 B2 | 10/2009 | Choi et al. | |
| 11,309,002 B2 | 4/2022 | Choi et al. | |
| 2003/0031082 A1* | 2/2003 | Sawada | ............... G11C 7/1066 365/233.1 |

(Continued)

FOREIGN PATENT DOCUMENTS

| | | |
|---|---|---|
| CN | 1941170 B | 4/2007 |
| TW | I324779 B | 5/2010 |

OTHER PUBLICATIONS

Office Action issued in connection with Taiwan Appl. No. 112134743 dated Jun. 21, 2024.

*Primary Examiner* — Min Huang
(74) *Attorney, Agent, or Firm* — Foley & Lardner LLP

(57)          ABSTRACT

A circuit includes one or more functional circuits, and a clock generation circuit operatively coupled to the one or more functional circuits. The clock generation circuit is configured to: receive a control signal to switch the one or more functional circuits between a first operation mode and a second operation mode; receive a first clock signal and a second clock signal corresponding to the first operation mode and the second operation mode, respectively; and output, to the one or more functional circuits, a clock pulse signal based on either the first clock signal or the second clock signal. The clock generation circuit is configured to generate either a first conduction path to output the clock pulse signal or a second conduction path to output the clock pulse signal. Each of the first and second conduction paths includes a predefined number of gate delays.

20 Claims, 10 Drawing Sheets

(56)                    References Cited

U.S. PATENT DOCUMENTS

| | | | |
|---|---|---|---|
| 2013/0142003 A1* | 6/2013 | Kohli ...................... | G11C 8/18 |
| | | | 365/233.1 |
| 2017/0110168 A1* | 4/2017 | Lee ........................ | G11C 7/222 |
| 2021/0134335 A1* | 5/2021 | Lee ........................ | G11C 7/222 |
| 2024/0161808 A1* | 5/2024 | Xu ........................ | H03L 7/0812 |

* cited by examiner

CLOCK GENERATION CIRCUITS FOR MEMORY DEVICES WITH BUILT-IN SELF TEST

BACKGROUND

Integrated circuits have become key components of many consumer and commercial electronic products, often replacing discrete components and enhancing functionality. The semiconductor processing technologies that produce these integrated circuits have advanced to the point wherein complete systems, including memories, can be reduced to a single integrated circuit, which can be an application specific integrated (ASIC) device or a system-on-a-chip (SOC) device. Embedded random access memory (RAM) is among the most widely used cores in current ASIC or SOC implementations. Embedded RAM gives rise to problems during chip manufacturing. For example, because an embedded RAM occupies a significant portion of a chip's area, the probability that a defect lies within the RAM is relatively high. The RAM thus becomes a controlling factor in chip yield. In addition, the embedding of RAM not only makes its own testing difficult, but also impairs testability of all other functions on chip, such as the core logic.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
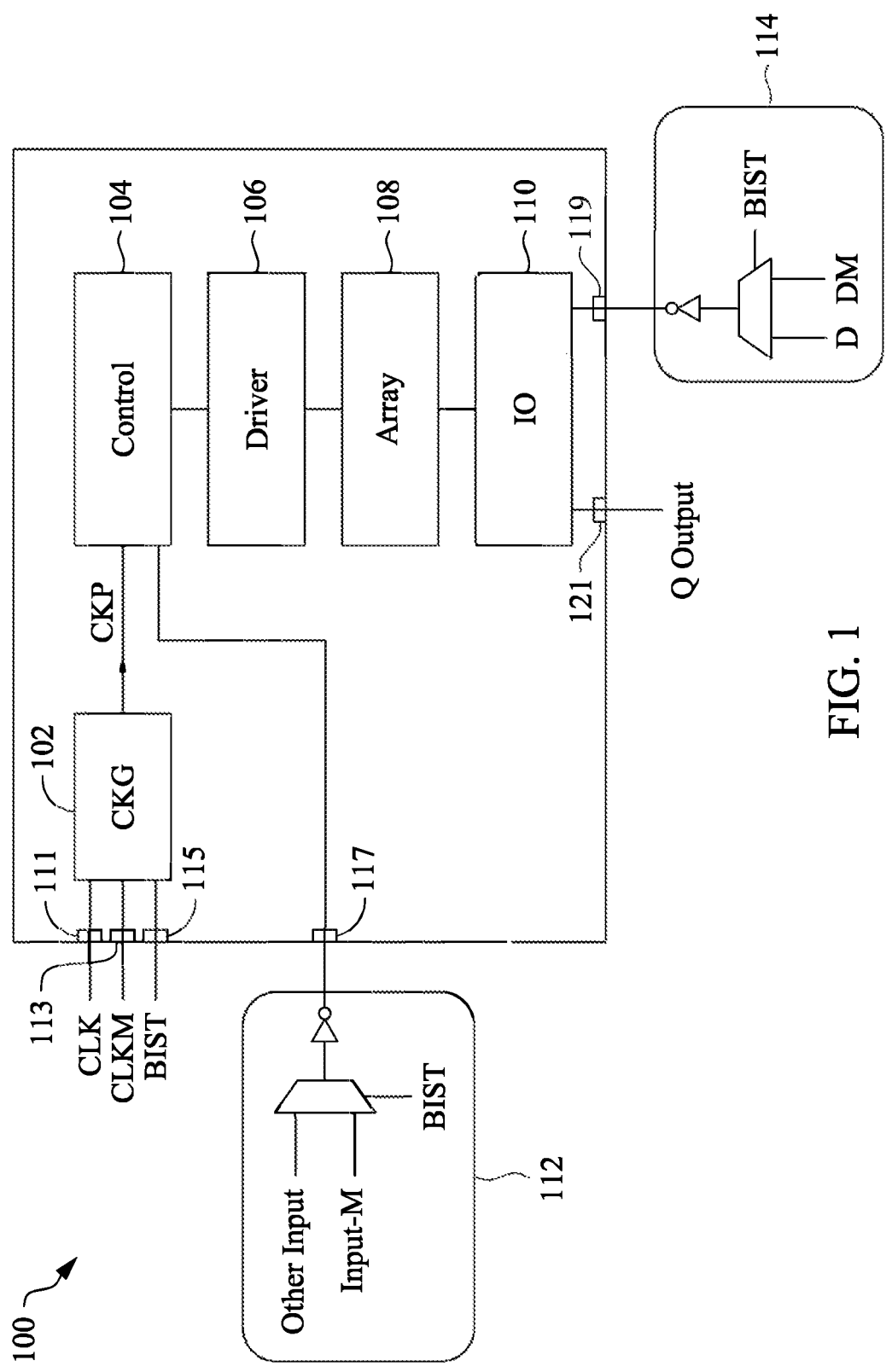
FIG. 1 illustrates a block diagram of a memory device configured with BIST functionality, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Testing an integrated device with an embedded function, such as a memory device which is built in a chip, may result in various problems as the embedded function may not be directly accessible from outside the chip. Generally, two methods have been utilized to test an embedded memory device in an integrated device. One method is to directly approach control terminals of the memory device from its input and output terminals, and the other is to embed in the memory device a circuit for automatically testing the memory device. Such built-in circuits are often referred to as a built-in self test (BIST) circuit.

The first approach of making the embedded memory device accessible through input/output terminals may be undesirable as such terminals occupy terminals which could otherwise be used by the memory device for other functions. Accordingly, making an embedded memory device (e.g., an array) externally accessible may be less efficient than testing the array internal to the memory device. Furthermore, special test equipment may be required to test the embedded memory device. In part as a result of the limitations of making an embedded memory device externally accessible, built-in self test circuits have been widely used to test a memory device within the chip. Built-in self test circuits can eliminate the need for input and output terminals added for testing the memory device and can be easily realized because of their simple construction. As a result, as a size of the embedded memory device increases, built-in self test circuits become more practical and useful.

In spite of these advantages, one disadvantage of a memory device with the built-in self test circuit is that an extra amount of gate delay(s) incurred by one or more selection and/or buffer circuits (e.g., multiplexers, inverters). For example, with such a built-in self test functionality, the memory device generally needs at least two clock signals corresponding to a test mode and a normal operation mode, respectively. To switch between these two modes, the existing memory device is typically connected to an outer or otherwise peripheral circuitry that selects one of the at least two clock signals based on under which mode the memory device is configured to operate. With such an extra circuitry, each of the clock signals may be inherently characterized with additional gate delays (e.g., 2 gate delays, one of which is incurred by a multiplexer and the other of which is incurred by an inverter). Accordingly, a total access time of the memory device may be slowed down by at least these gate delays. Thus, the existing memory device with built-in self test functionality has not been entirely satisfactory in some aspects.

The present disclosure provides various embodiments of a memory device that includes a "built-in" clock generation circuit that directly receives clock signals from a clock source and outputs desired clock signals (in normal operation mode or in built-in self test mode) to one or more functional circuits of the memory device, without the above-described gate delays. The term "built-in" may refer to a circuit that is fabricated as part of a bigger circuit/device. For example, the disclosed clock generation circuit is fabricated as part of the memory device, i.e., sharing one or more input/output pins or terminals. In one aspect of the present disclosure, the clock generation circuit can directly receive a first clock signal and a second clock signal (e.g., one of which is toggled while the other of which is kept at logic low), and generate a desired clock signal, hereinafter referred to as a "clock pulse signal (CKP)," based on a control signal for the following functional circuits. In another aspect of the present disclosure, the clock generation circuit can directly receive a first clock signal and a second clock signal (e.g., one of which is toggled while the other of which is kept at logic low), and generate a CKP for the following functional circuits based on a combination of a clock enable signal and the control signal. Regardless of which of the aspects is implemented, due to directly receiving the clock signal and control signal through the pins of the memory device, a number of gate delays from (receiving) the clock signal to (generating) the clock pulse signal CKP can be suppressed equal to or less than 2, which can significantly enhance operation speed of the memory device.

FIG. 1 illustrates a schematic diagram of the a memory device 100, in accordance with various embodiments. The memory device 100 is a type of an integrated circuit (IC) device. In at least one embodiment, the memory device 100 is an individual IC device. In some embodiments, the memory device 100 is included as a part of a larger IC device which includes circuitry other than the memory device for other functionalities. Further, the memory device 100 illustrated in FIG. 1 is merely a simplified example, and can include any of various other components/circuits while remaining within the scope of the present disclosure.

As shown, the memory device 100 includes a clock generation (CKG) circuit 102, a control circuit 104, a driver circuit 106, a memory array 108, and an input/output (I/O) circuit 110. The memory array 108 generally includes a plural number of memory cells arranged across a plurality of columns and a plurality of rows. Along each column, the memory array 108 includes at least a pair of bit lines (BL/BLB), and along each row, the memory array 108 includes at least one word line (WL). Each of the memory cells can be accessed (e.g., read, programmed) through a respective combination of the BL/BLB and WL. The control circuit 104 can include a number of logic circuits configured to generate a number of internal control signals and decode address information received. The decoded address information can be utilized to locate one or more of the memory cells of the memory array 108. The driver circuit 106 can include at least one of a word line driver or a bit line driver operatively coupled between the control circuit 104 and the memory array 108. The word line driver and the bit line driver can utilize the decoded address information to access the corresponding memory cell. The I/O circuit 110 can include a number of logic circuits configured to receive data to be programmed into the memory array 108. The I/O circuit 110 can further include a number of sense amplifiers to read data from the memory array 108.

In at least one embodiment, the memory device 100 is a volatile memory device, and the memory cells of the memory array 108 are Static Random Access Memory (SRAM) cells. Other types of memory devices are within the scopes of various embodiments. Example memory types of the memory device 100 include, but are not limited to, SRAM devices, dynamic random access memory (DRAM) devices, or the like.

In various embodiments of the present disclosure, the CKG circuit 102 is configured to directly receive a first clock signal (CLK), a second clock signal (CLKM), and a built-in self test control signal (BIST). The CKG circuit 102 may receive these three signals through input pins (or terminals), 111, 113, and 115, respectively. In some embodiments, such input pins 111 to 115 may be directly connected to respective inputs of the CKG circuit 102. The first clock signal CLK or the second clock signal CLKM may be outputted by the CKG circuit 102 according to the control signal BIST. For example, when the control signal BIST is asserted to logic high, the second clock signal CLKM is received as toggling between logic high and low over time, while the first clock signal CLK is received as constantly logic low; and when the control signal BIST is not asserted to logic high, the first clock signal CLK is received as toggling between logic high and low over time, while the second clock signal CLKM is received as constantly logic low. Further, when the control signal BIST is asserted to logic high, the memory device 100 is configured to operate under a BIST mode (e.g., receiving a number of test patterns and testing the functional circuits 104 to 110 based on the test patterns); and when the control signal BIST is not asserted to logic high, the memory device 100 is configured to operate under a normal operation mode (e.g., reading data from the memory array 108, programming data into the memory array 108). Alternatively stated, when the memory device 100 is at the BIST mode, the second clock signal CLKM is selected for operating the memory device 100; and when the memory device 100 is at the normal operation mode, the first clock signal CLK is selected for operating the memory device 100.

Based on the selected clock signal (CLK or CLKM), the CKG circuit 102 can generate an internal clock pulse signal (CKP) at its output to drive or otherwise operate the following functional circuits, e.g., the control circuit 104, the driver circuit 106, the array 108, and the I/O circuit 110. By directly receiving and then selecting the clock signal through the CKG circuit 102 integrated within the memory device 100, a number of gate delays from the input pin (receiving the clock signal CLK/CLKM) to an internal node (outputting the CKP signal) can be advantageously reduced to 2. In the existing memory device with built-in self test functionality, a conduction path from receiving an outer clock signal to outputting an internal clock pulse signal typically propagates through at least 4 gate delays, which can disadvantageously slow down operation speed of the corresponding memory device. Thus, by significantly reducing the number of gate delays (e.g., reducing it by at least one half), operation speed of the memory device 100, as disclosed herein, can be largely improved.

The memory device 100 may further include other input/output pins, 117, 119, and 121. For example, the memory device 100 can be operatively coupled to a first BIST circuit 112 through the input pin 117; the memory device 100 can be operatively coupled to a second BIST circuit 114 through the input pin 119; and the memory device 100 can output read data (Q) through the output pin 121. In some embodiments, the first BIST circuit 112 and the second BIST circuit 114 can each include a pattern generator configured to execute a testing sequence to automatically write and read locations in the memory device 100. The testing sequence may include any type of memory testing pattern useful for comprehensive testing of such a memory device 100.

Figure 2:
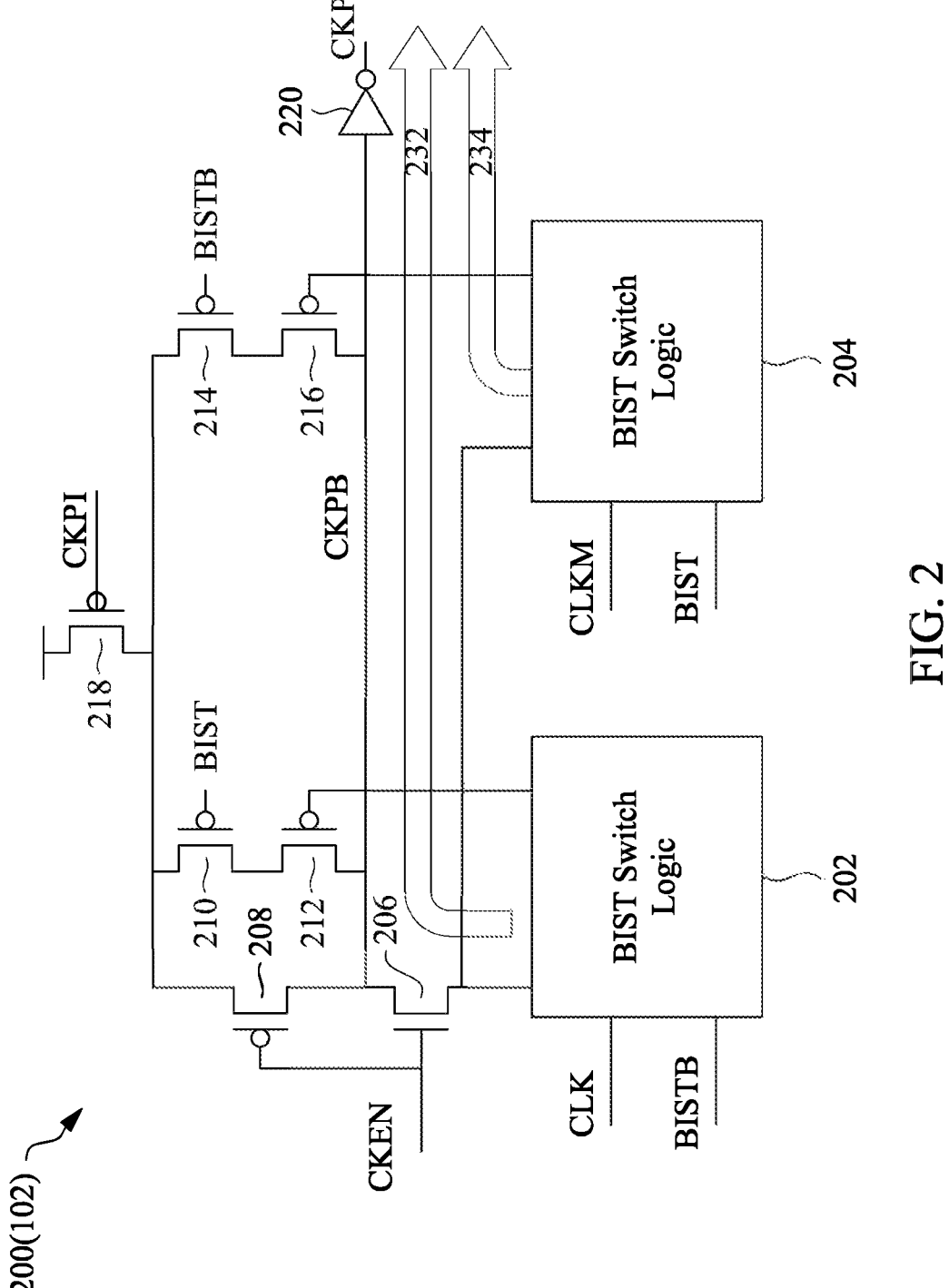
FIG. 2 illustrates a schematic diagram of a clock generation circuit of the memory device of FIG. 1, in accordance with some embodiments.

FIG. 2 illustrates a schematic diagram of a first implementation of the clock generation circuit (CKG) 102 of FIG. 1, in accordance with various embodiments. Hereinafter, the clock generation circuit shown in FIG. 2 is referred to as "clock generation circuit 200." In brief overview, the clock generation circuit 200 includes a first BIST switch logic circuit and a second BIST switch logic circuit. The first BIST switch logic circuit is configured to directly receive the first clock signal CLK and a logic inverse to the control signal (BISTB) and the second BIST switch logic circuit is configured to directly receive the second clock signal CLKM and the control signal BIST, so as to select one of the first clock signal CLK or second clock signal CLKM as a clock pulse signal (CKP). The first and second BIST switch logic circuits of FIG. 2 may include various combinations of logic gates or components of the present disclosure, which will be discussed in further detail with respect to FIGS. 4 and 5.

As shown in FIG. 2, the clock generation circuit 200 includes a first BIST switch logic circuit 202, a second BIST switch logic circuit 204, a number of transistors 206, 208, 210, 212, 214, 216, and 218, and an inverter 220. The transistor 206 may be implemented as an n-type metal-oxide-semiconductor transistor, and the transistors 208 to 218 may each be implemented as a p-type metal-oxide-semiconductor transistor, while the transistors 206 to 218 may each be implemented as any of various other types of transistors while remaining within the scope of the present disclosure.

The first BIST switch logic circuit 202 can receive the first clock signal CLK and a logic inverse to the control signal BISTB. The second BIST switch logic circuit 204 can receive the second clock signal CLKM and the control signal BIST. The transistors 206 and 208 may be gated by an internal clock enable signal (CKEN), which may be generated by a control circuit (e.g., 104). The transistor 210 may be gated by the control signal BIST. The transistor 212 may be gated by the first clock signal CLK. The transistor 214 may be gated by the control signal BISTB. The transistor 216 may be gated by the second clock signal CLKM. The transistor 218 may be gated by another internal signal CKPI, which may be generated by a control circuit (e.g., 104). A logic state of the signal CKPI may change in accordance with the first clock signal CLK or second clock signal CLKM, in some embodiments.

In some embodiments, the first BIST switch logic circuit 202 is activated and the second BIST switch logic circuit 204 is deactivated, when the control signal BIST is at logic low and the control signal BISTB is at logic high (e.g., the normal operation mode); and the second BIST switch logic circuit 204 is activated and the first BIST switch logic circuit 202 is deactivated, when the control signal BIST is at logic high and the control signal BISTB is at logic low (e.g., the BIST mode). When at the normal operation mode, a first conduction path 232 can be intervally or periodically formed to output the first clock signal CLK as the clock pulse signal CKP. When at the BIST mode, a second conduction path 234 can be intervally or periodically formed to output the second clock signal CLKM as the clock pulse signal CKP. Specifically, the clock enable signal CKEN can be first asserted to logic high when either of the first BIST switch logic circuit 202 or second BIST switch logic circuit 204 is activated, next to logic low for a predetermined period of time, and then back to logic high after the predetermined period of time elapses. The clock enable signal CKEN may be asserted to logic high when a chip enable signal (CE) is at logic high and the first clock signal CLK or second clock signal CLKM is at logic low. When the chip enable signal CE is asserted at logic high, the whole memory device 100 is allowed to access (e.g., test, read, program).

Alternatively stated, after either the first BIST switch logic circuit 202 or second BIST switch logic circuit 204 is activated (e.g., either the first clock signal CLK or the second clock signal CLKM is provided), the clock enable signal CKEN may transition to logic low to block the first clock signal CLK or the second clock signal CLKM from an output of the CKG circuit 200 (i.e., outputting the clock pulse signal CKP) for the predetermined period of time. The clock enable signal CKEN may not transition to logic high until the predetermined period of time elapses (and the provided clock signal transitions to logic low). Equivalently, the clock pulse signal CKP is configured to have a lower frequency than the provided first/second clock signal CLK/ CLKM, and a ratio of the lower frequency (of CKP) to the higher frequency (of CLK/CLKM) is determined by the "blocking" period of time. As a non-limiting example, given a 5 GHz of the first/second clock signal CLK/CLKM provided, the clock pulse signal CKP may be generated at 1 GHz.

For example, when the control signal BIST is configured at logic low (i.e., the control signal BISTB at logic high), the first BIST switch logic circuit 202 is activated and the second BIST switch logic circuit 204 is deactivated. Further, the transistor 206 is first turned on and then turned off by the clock enable signal CKEN; the transistor 210 is turned on by the control signal BIST, with the transistor 212 turned on and off according to the toggled first clock signal CLK; and the transistor 214 is turned off by the control signal BISTB, with the transistor 216 turned on according to the second clock signal CLKM that remains at logic low. As such, the first conduction path 232 is first formed (in response to the clock enable signal CKEN transitioning to logic high) to propagate from the first BIST switch logic circuit 202, through the toggled transistor 206, and to the inverter 220, and then deformed (in response to the clock enable signal CKEN transitioning to logic low). As will be discussed in detail below, the first clock signal CLK travels through only one gate terminal inside the first BIST switch control logic circuit 202. Thus, the first conduction path 232 propagates through only two gate delays.

When the control signal BIST is configured at logic high (i.e., the control signal BISTB at logic low), the first BIST switch logic circuit 202 is deactivated and the second BIST switch logic circuit 204 is activated. Further, the transistor 206 is first turned on and then off by the clock enable signal CKEN; the transistor 210 is turned off by the control signal BIST, with the transistor 212 turned off according to the first clock signal CLK that remains at logic low; and the transistor 214 is turned on by the control signal BISTB, with the transistor 216 turned on and off according to the toggled second clock signal CLKM. As such, the second conduction path 234 is first formed (in response to the clock enable signal CKEN transitioning to logic high) to propagate from the second BIST switch logic circuit 204, through the toggled transistor 206, and to the inverter 220, and then deformed (in response to the clock enable signal CKEN transitioning to logic low). As will be discussed in detail below, the second clock signal CLKM travels through only one gate terminal inside the second BIST switch control logic circuit 204. Thus, the second conduction path 234 propagates through only two gate delays.

Figure 3:
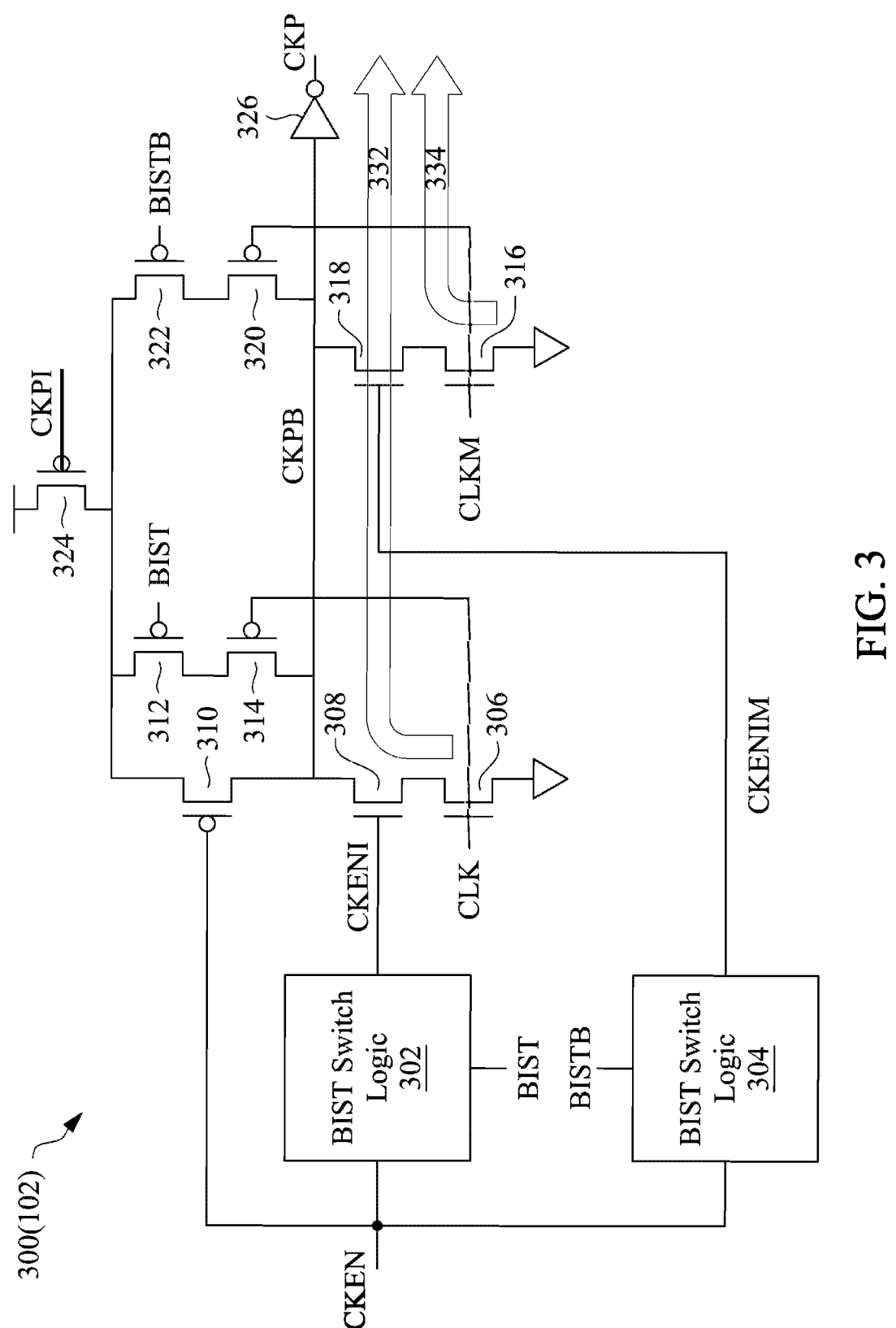
FIG. 3 illustrates a schematic diagram of another clock generation circuit of the memory device of FIG. 1, in accordance with some embodiments.

FIG. 3 illustrates a schematic diagram of a second implementation the clock generation (CKG) circuit 102 of FIG. 1, in accordance with various embodiments. Hereinafter, the clock generation circuit shown in FIG. 3 is referred to as "clock generation circuit 300." In brief overview, the clock generation circuit 300 includes a first BIST switch logic circuit and a second BIST switch logic circuit. The first BIST switch logic circuit is configured to directly receive a logic inverse to the control signal (BISTB) and the second BIST switch logic circuit is configured to directly receive the control signal BIST, so as to generate intermediate clock enable signals (CKENI/CKENIM) for selecting one of the directly received first clock signal CLK or second clock signal CLKM as a clock pulse signal (CKP). The first and second BIST switch logic circuits of FIG. 3 may include various combinations of logic gates or components of the present disclosure, which will be discussed in further detail with respect to FIGS. 6, 7, and 8.

As shown in FIG. 3, the clock generation circuit 300 includes a first BIST switch logic circuit 302, a second BIST switch logic circuit 304, a number of transistors 306, 308, 310, 312, 314, 316, 318, 320, 322, and 324, and an inverter 326. The transistor 306, 308, 316, and 318 may be implemented as an n-type metal-oxide-semiconductor transistor, and the transistors 310, 312, 314, 320, 322, and 324 may each be implemented as a p-type metal-oxide-semiconductor transistor, while the transistors 306 to 324 may each be implemented as any of various other types of transistors while remaining within the scope of the present disclosure.

The first BIST switch logic circuit 302 can receive the internal clock enable signal CKEN, and the control signal BIST (or its logic inverse, BISTB) to generate the intermediate clock enable signal CKENI. The second BIST switch logic circuit 304 can receive the same internal clock enable signal CKEN, and the control signal BIST (or its logic inverse, BISTB) to generate the intermediate clock enable signal CKENIM. The intermediate clock enable signal CKENI and CKENIM are configured to gate the transistors 308 and 318, respectively. The transistor 306, serially connected to the transistor 308, may be gated by the first clock signal CLK; and the transistor 316, serially connected to the transistor 318, may be gated by the second clock signal CLKM. The transistor 310 may be gated by the clock enable signal CKEN. The transistor 312 may be gated by the control signal BIST. The transistor 314 may be gated by the first clock signal CLK. The transistor 322 may be gated by the control signal BISTB. The transistor 320 may be gated by the second clock signal CLKM. The transistor 324 may be gated by another internal signal CKPI, which may be generated by a control circuit (e.g., 104). A logic state of the signal CKPI may change in accordance with the first clock signal CLK or second clock signal CLKM, in some embodiments.

In some embodiments, the first BIST switch logic circuit 302 is activated and the second BIST switch logic circuit 304 is deactivated, when the control signal BIST is at logic low and the control signal BISTB is at logic high (e.g., the normal operation mode); and the second BIST switch logic circuit 304 is activated and the first BIST switch logic circuit 302 is deactivated, when the control signal BIST is at logic high and the control signal BISTB is at logic low (e.g., the BIST mode). Similarly, the clock enable signal CKEN can be first asserted to logic high when either of the first BIST switch logic circuit 302 or second BIST switch logic circuit 304 is activated, next to logic low for a predetermined period of time, and then back to logic high after the predetermined period of time elapses. Accordingly, When at the normal operation mode, following the clock enable signal CKEN, the intermediate clock enable signal CKENI is first pulled up to logic high, next to logic low, and then to logic low, and a first conduction path 332 can be intervally or periodically formed to output the first clock signal CLK as the clock pulse signal CKP. When at the BIST mode, following the clock enable signal CKEN, the intermediate clock enable signal CKENIM is first pulled up to logic high, next to logic low, and then to logic low, a second conduction path 334 can be intervally or periodically formed to output the second clock signal CLKM as the clock pulse signal CKP.

For example, when the control signal BIST is configured at logic low (i.e., the control signal BISTB at logic high), the first BIST switch logic circuit 302 is activated and the second BIST switch logic circuit 304 is deactivated. The first BIST switch logic circuit 302 can first pull up, next pull down, and then pull up the intermediate clock enable signal CKENI based on a logic combination of the clock enable signal CKEN and the control signal BIST. The transistors 308 and 306 are turned on and off by the intermediate clock enable signal CKENI and the first clock signal CLK, respectively. As indicated above, the intermediate clock enable signal CKENI, which follows the clock enable signal CKEN, may have a lower frequency than the first clock signal CLK. As such, the first conduction path 332 is intervally or periodically formed to propagate through the transistors 306-308 and the inverter 326, which includes only two gate delays.

When the control signal BIST is configured at logic high (i.e., the control signal BISTB at logic low), the first BIST switch logic circuit 302 is deactivated and the second BIST switch logic circuit 304 is activated. The second BIST switch logic circuit 304 can first pull up, next pull down, and then pull up the intermediate clock enable signal CKENIM based on a logic combination of the clock enable signal CKEN and the control signal BISTB. The transistors 318 and 316 are turned on and off by the intermediate clock enable signal CKENIM and the second clock signal CLKM, respectively. As indicated above, the intermediate clock enable signal CKENIM, which follows the clock enable signal CKEN, may have a lower frequency than the second clock signal CLKM. As such, the second conduction path 334 is intervally or periodically formed to propagate through the transistors 316-318 and the inverter 326, which includes only two gate delays.

Figure 4:
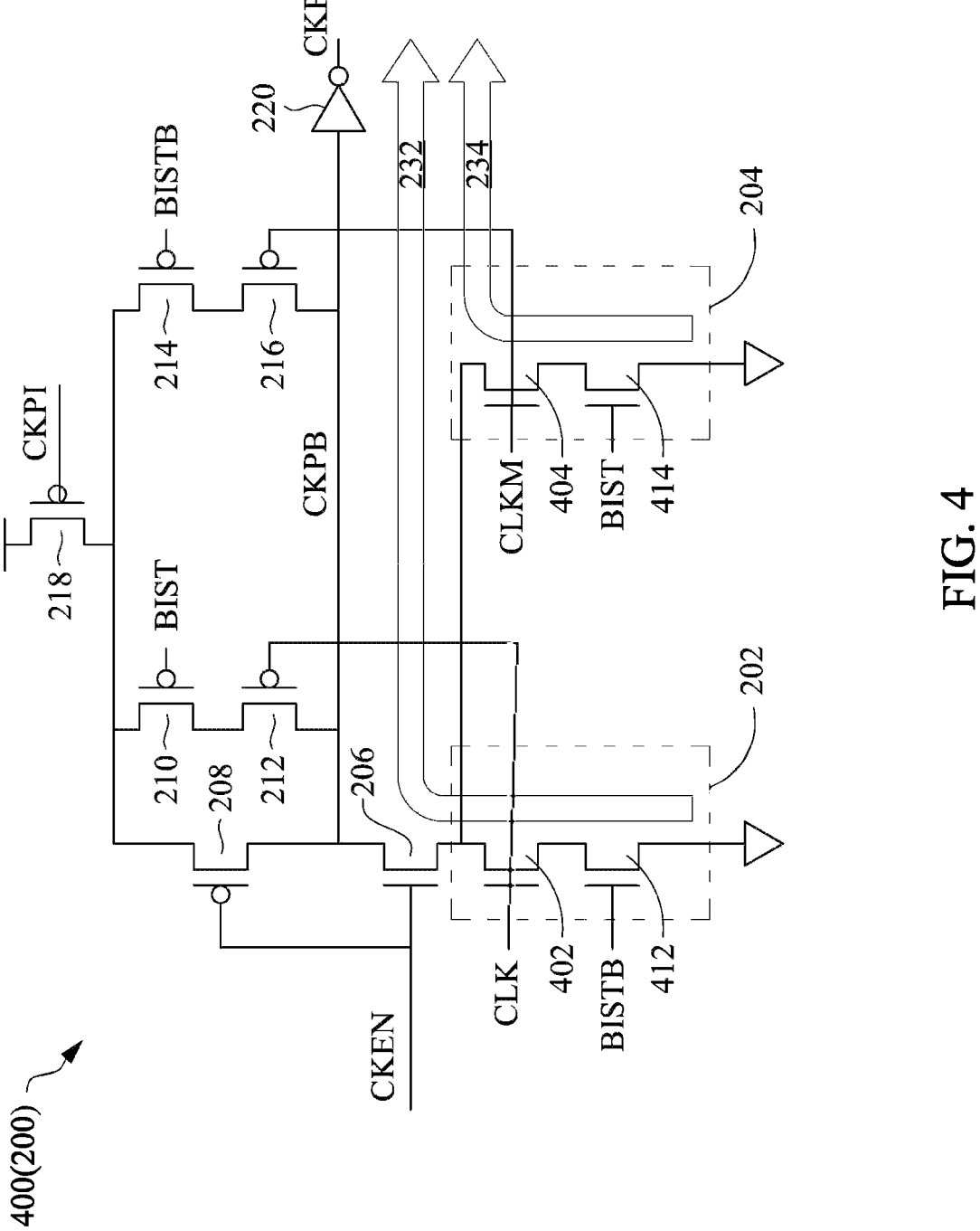
FIGS. 4 and 5 illustrate example circuit diagrams of the clock generation circuit shown in FIG. 2, in accordance with some embodiments.
Figure 5:
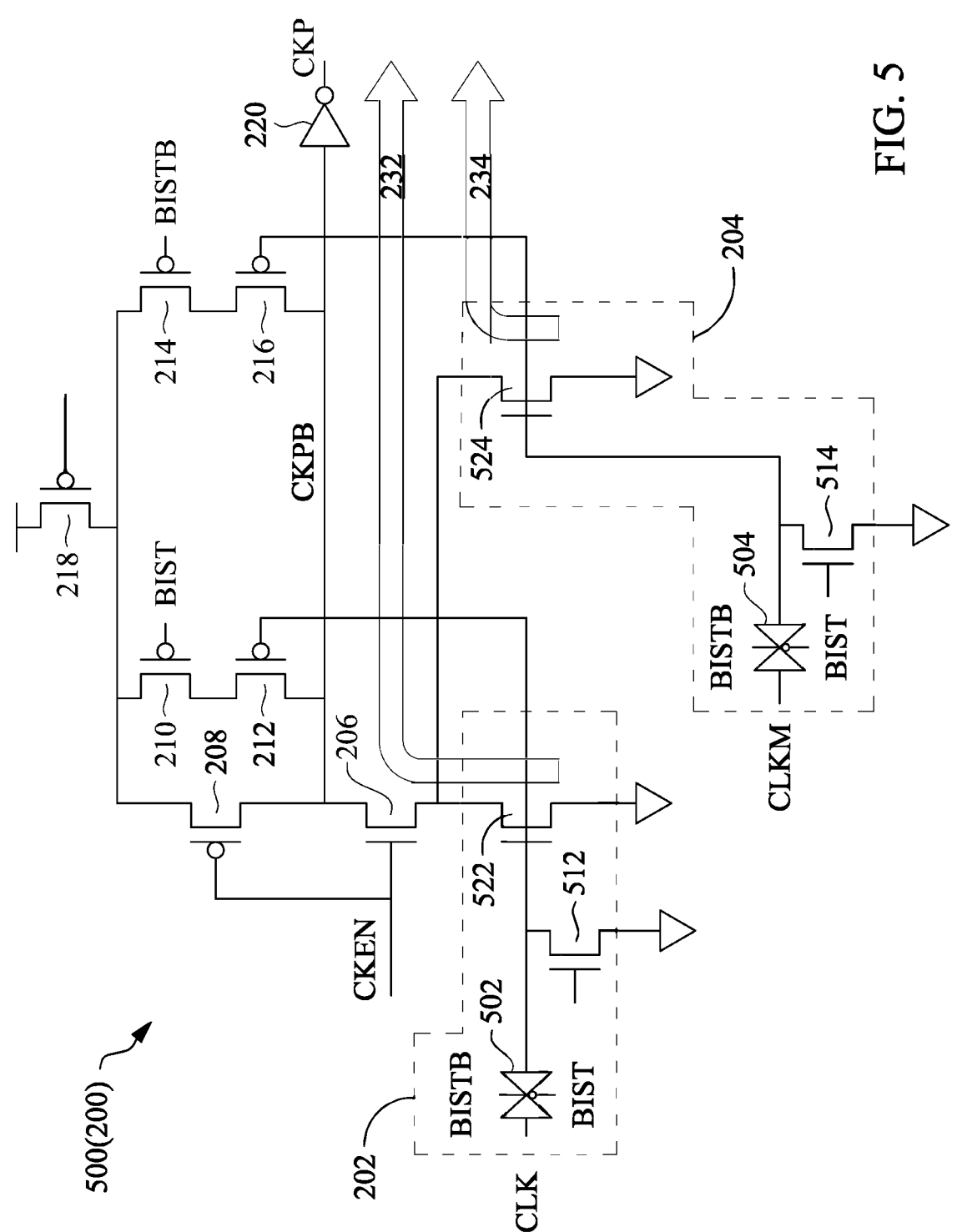
Figure 6:
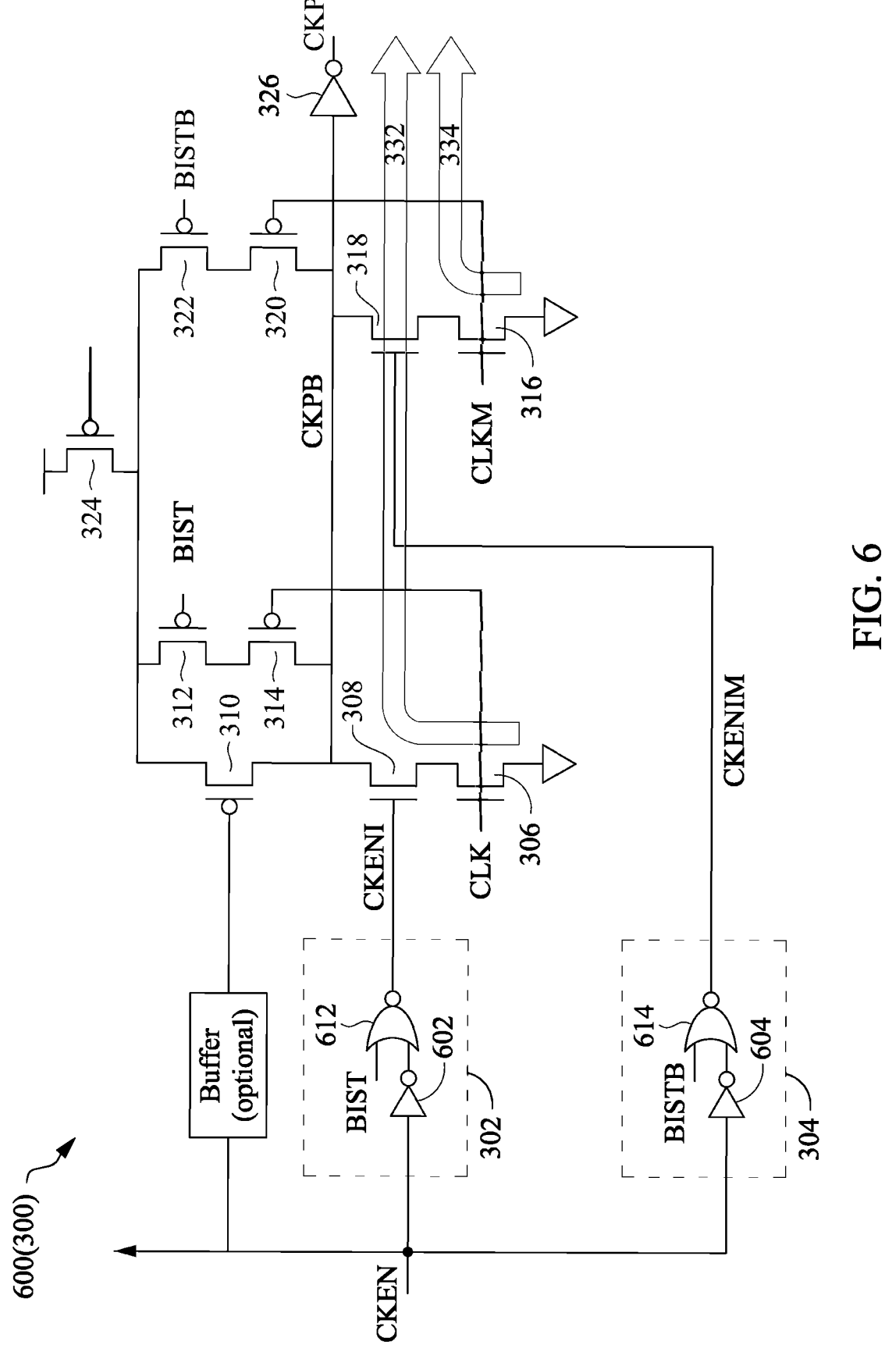
FIGS. 6, 7, and 8 illustrate example circuit diagrams of the clock generation circuit shown in FIG. 3, in accordance with some embodiments.
Figure 7:
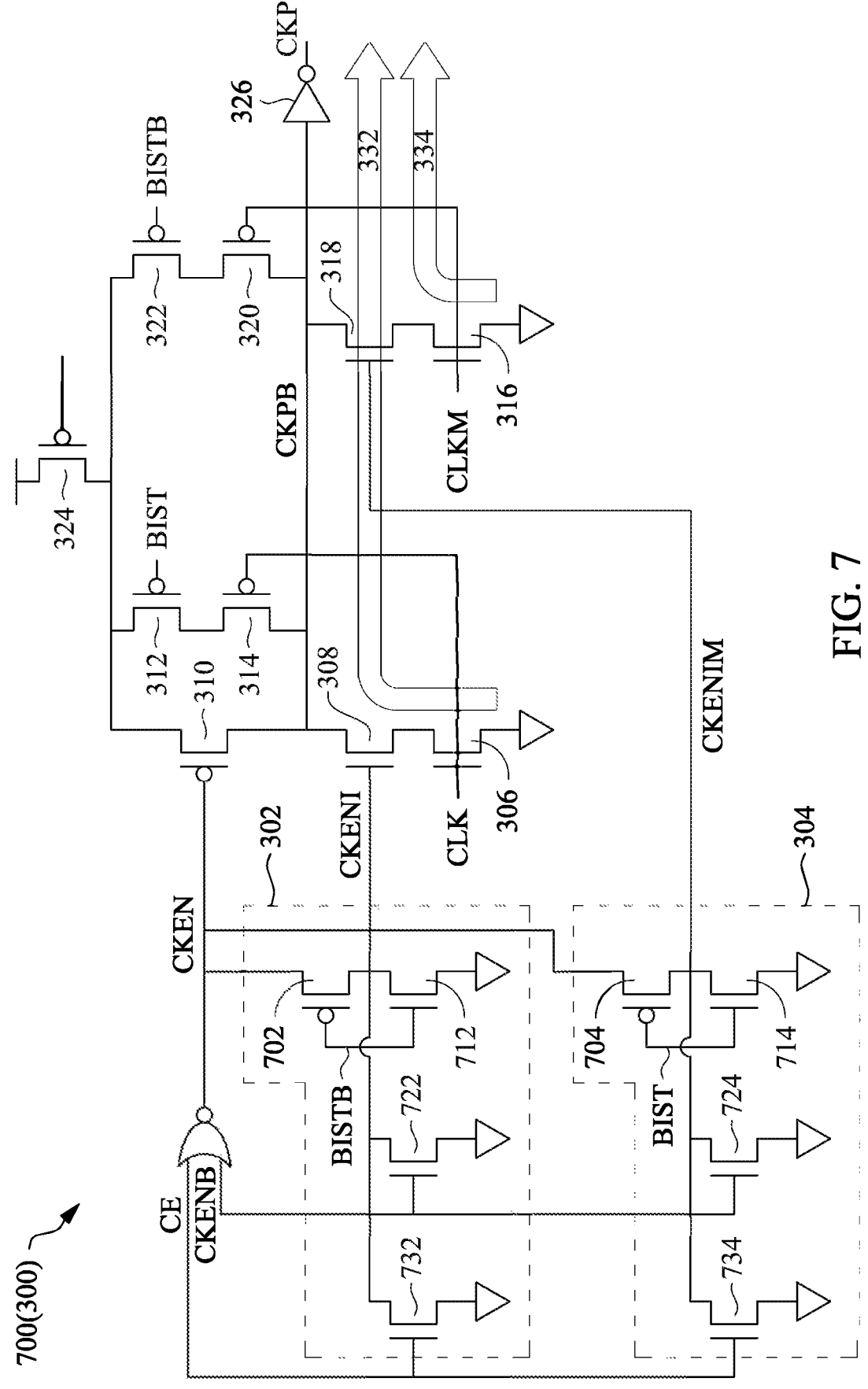
Figure 8:
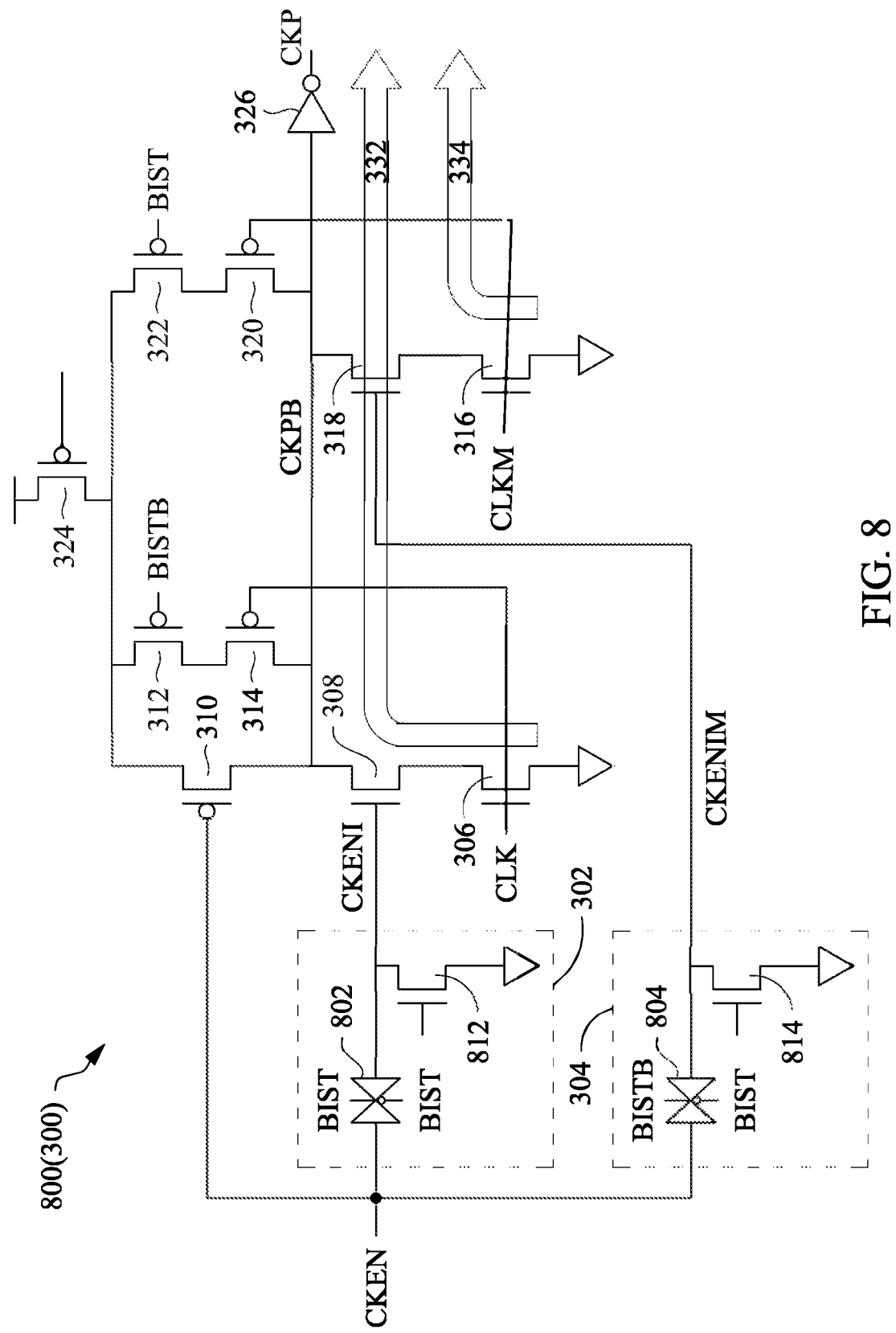

FIGS. 4 to 8 respectively illustrate example circuit diagrams of the clock generation circuit 102 (FIG. 1), in accordance with various embodiments. Specifically, FIGS. 4 and 5 illustrate various example circuit diagrams of the clock generation circuit 200 (FIG. 2); and FIGS. 6, 7, and 8 illustrate various example circuit diagrams of the clock generation circuit 300 (FIG. 3). Thus, some of the reference numerals of FIG. 2 may be reused in FIGS. 4 and 5; and some of the reference numerals of FIG. 3 may be reused in FIGS. 6, 7, and 8. It should be understood that the clock generation circuit 200 or clock generation circuit 300 is not limited to the circuit diagrams shown in FIGS. 4-8. Other circuit diagrams may also be contemplated.

Referring first to FIG. 4, an implementation of the clock generation circuit 200 is depicted, hereinafter "clock generation circuit 400." In FIG. 4, the first BIST switch logic circuit 202 includes transistors 402 and 412; and the second BIST switch logic circuit 204 includes transistors 404 and 414. Although the transistors 402 to 414 are each implemented as an n-type metal-oxide-semiconductor transistor in the illustrated example of FIG. 4, it should be understood that the transistors 402 to 414 can each implemented as any of various other transistors while remaining within the scope of the present disclosure. The transistors 402 and 412 of the first BIST switch logic circuit 202 are gated by the first clock signal CLK and the control signal BISTB, respectively; and the transistors 404 and 414 of the second BIST switch logic circuit 204 are gated by the second clock signal CLKM and the control signal BIST, respectively.

As a result, when the control signal BIST is received as logic low (i.e., the control signal BISTB is at logic high), the transistor 412 is turned on and the transistor 402 can be toggled (by the first clock signal CLK) to form the first conduction path 232, i.e., outputting the first clock signal CLK as the clock pulse signal CKP with a different (e.g., slower) frequency. On the other hand, when the control signal BIST is received as logic high (i.e., the control signal BISTB is at logic low), the transistor 414 is turned on and the transistor 404 can be toggled (by the second clock signal CLKM) to form the second conduction path 234, i.e., outputting the second clock signal CLKM as the clock pulse signal CKP with a different (e.g., slower) frequency.

Referring next to FIG. 5, another implementation of the clock generation circuit 200 is depicted, hereinafter "clock generation circuit 500." In FIG. 5, the first BIST switch logic circuit 202 includes a transmission gate 502 and transistors 512 and 522; and the second BIST switch logic circuit 204 includes a transmission gate 504 and transistors 514 and 524. Although the transistors 512-522 and 514-524 are each implemented as an n-type metal-oxide-semiconductor transistor in the illustrated example of FIG. 5, it should be understood that the transistors 512-522 and 514-524 can each implemented as any of various other transistors while remaining within the scope of the present disclosure. The transmission gate 502 can be controlled by the control signals BIST and BISTB to selectively pass the first clock signal CLK; and the transmission gate 504 can be controlled by the control signals BIST and BISTB to selectively pass the second clock signal CLKM. When the first clock signal CLK is allowed to pass, the transistor 522 can be gated by the first clock signal CLK; and when the second clock signal CLKM is allowed to pass, the transistor 524 can be gated by the second clock signal CLKM.

As a result, when the control signal BIST is received as logic low (i.e., the control signal BISTB is at logic high), the first clock signal CLK is allowed to pass through the transmission gate 502, and can thus gate (e.g., toggle) the transistor 522. The first conduction path 232 can thus be formed, i.e., outputting the first clock signal CLK as the clock pulse signal CKP with a different (e.g., slower) frequency. On the other hand, when the control signal BIST is received as logic high (i.e., the control signal BISTB is at logic low), the second clock signal CLKM is allowed to pass through the transmission gate 504, and can thus gate (e.g., toggle) the transistor 524. The second conduction path 234 can thus be formed, i.e., outputting the second clock signal CLKM as the clock pulse signal CKP with a different (e.g., slower) frequency.

Referring next to FIG. 6, an implementation of the clock generation circuit 300 is depicted, hereinafter "clock generation circuit 600." In FIG. 6, the first BIST switch logic circuit 302 includes an inverter 602 and a NOR gate 612; and the second BIST switch logic circuit 304 includes an inverter 604 and a NOR gate 614. The NOR gate 612 has two inputs, one of which receives the control signal BIST and the other of which receives a logic inverse of the internal clock enable signal CKEN; and the NOR gate 614 has two inputs, one of which receives the control signal BISTB and the other of which receives the logic inverse of the internal clock enable signal CKEN.

As a result, when the control signal BIST is received as logic low (i.e., the control signal BISTB is at logic high), the NOR gate 612 can toggle the intermediate clock enable signal CKENI (a NOR'ed signal of the control signal BIST and the logic inverse of the internal clock enable signal CKEN) with a frequency based on the frequency of the clock enable signal CKEN, and the NOR gate 614 can keep the intermediate clock enable signal CKENIM (a NOR'ed signal of the control signal BISTB and the logic inverse of the internal clock enable signal CKEN) at logic low. The conduction path 332 can thus be intervally or periodically formed, i.e., outputting the first clock signal CLK as the clock pulse signal CKP with a different (e.g., slower) frequency. On the other hand, when the control signal BIST is received as logic high (i.e., the control signal BISTB is at logic low), the NOR gate 614 can toggle the intermediate clock enable signal CKENIM (a NOR'ed signal of the control signal BISTB and the logic inverse of the internal clock enable signal CKEN) with a frequency based on the frequency of the clock enable signal CKEN, and the NOR gate 612 can keep the intermediate clock enable signal CKENI (a NOR'ed signal of the control signal BIST and the logic inverse of the internal clock enable signal CKEN) at logic low. The conduction path 334 can thus be intervally or periodically formed, i.e., outputting the second clock signal CLKM as the clock pulse signal CKP with a different (e.g., slower) frequency.

Referring next to FIG. 7, another implementation of the clock generation circuit 300 is depicted, hereinafter "clock generation circuit 700." In FIG. 7, the first BIST switch logic circuit 302 includes transistors 702, 712, 722, and 732; and the second BIST switch logic circuit 304 includes transistors 704, 714, 724, and 734. Although the transistors 712-732 and 714-734 are each implemented as an n-type metal-oxide-semiconductor transistor and the transistor 702 and transistor 704 are each implemented as a p-type metal-oxide-semiconductor transistor in the illustrated example of FIG. 7, it should be understood that the transistors 702-732 and 704-734 can each implemented as any of various other transistors while remaining within the scope of the present disclosure. The transistors 702 and 712 may form a first inverter receiving the control signal BISTB as its input signal and outputting the intermediate clock enable signal CKENI as its output signal; and the transistors 704 and 714 may form a second inverter receiving the control signal BIST as its input signal and outputting the intermediate clock enable signal CKENIM as its output signal. Further, each of the first and second inverters is biased between the internal clock enable signal CKEN and ground.

As a result, when the control signal BIST is received as logic low (i.e., the control signal BISTB is at logic high), the intermediate clock enable signal CKENIM is outputted by the second inverter formed by the transistors 704 and 714 as toggling between logic high and low with a frequency based on the frequency of the clock enable signal CKEN, and the intermediate clock enable signal CKENI remains at logic low. The conduction path 334 can thus be intervally or periodically formed, i.e., outputting the second clock signal CLKM as the clock pulse signal CKP with a different (e.g., slower) frequency. On the other hand, when the control signal BIST is received as logic high (i.e., the control signal BISTB is at logic low), the intermediate clock enable signal CKENI is outputted by the first inverter formed by the transistors 702 and 712 as toggling between logic high and low with a frequency based on the frequency of the clock enable signal CKEN, and the intermediate clock enable signal CKENIM remains at logic low. The conduction path 332 can thus be intervally or periodically formed, i.e., outputting the first clock signal CLK as the clock pulse signal CKP with a different (e.g., slower) frequency.

Referring next to FIG. 8, yet another implementation of the clock generation circuit 300 is depicted, hereinafter "clock generation circuit 800." In FIG. 8 the first BIST switch logic circuit 302 includes a transmission gate 802 and transistor 812; and the second BIST switch logic circuit 304 includes a transmission gate 804 and transistor 814. Although the transistors 812 and 814 are each implemented as an n-type metal-oxide-semiconductor transistor in the illustrated example of FIG. 8, it should be understood that the transistors 812 and 814 can each implemented as any of various other transistors while remaining within the scope of the present disclosure. The transmission gate 802 can be controlled by the control signals BIST and BISTB to selectively pass the internal clock enable signal CKEN; and the transmission gate 804 can be controlled by the control signals BIST and BISTB to selectively pass the internal clock enable signal CKEN. The transmission gates 802 and 804 are configured to be alternately turned on.

As a result, when the control signal BIST is received as logic low (i.e., the control signal BISTB is at logic high), the clock enable signal CKEN is allowed to pass through the transmission gate 802, and can thus gate (e.g., toggle) the transistor 308. The first conduction path 332 can thus be formed, i.e., outputting the first clock signal CLK as the clock pulse signal CKP with a different (e.g., slower) frequency. On the other hand, when the control signal BIST is received as logic high (i.e., the control signal BISTB is at logic low), the clock enable signal CKEN is allowed to pass through the transmission gate 804, and can thus gate (e.g., toggle) the transistor 318. The second conduction path 334 can thus be formed, i.e., outputting the second clock signal CLKM as the clock pulse signal CKP with a different (e.g., slower) frequency.

Figure 9:
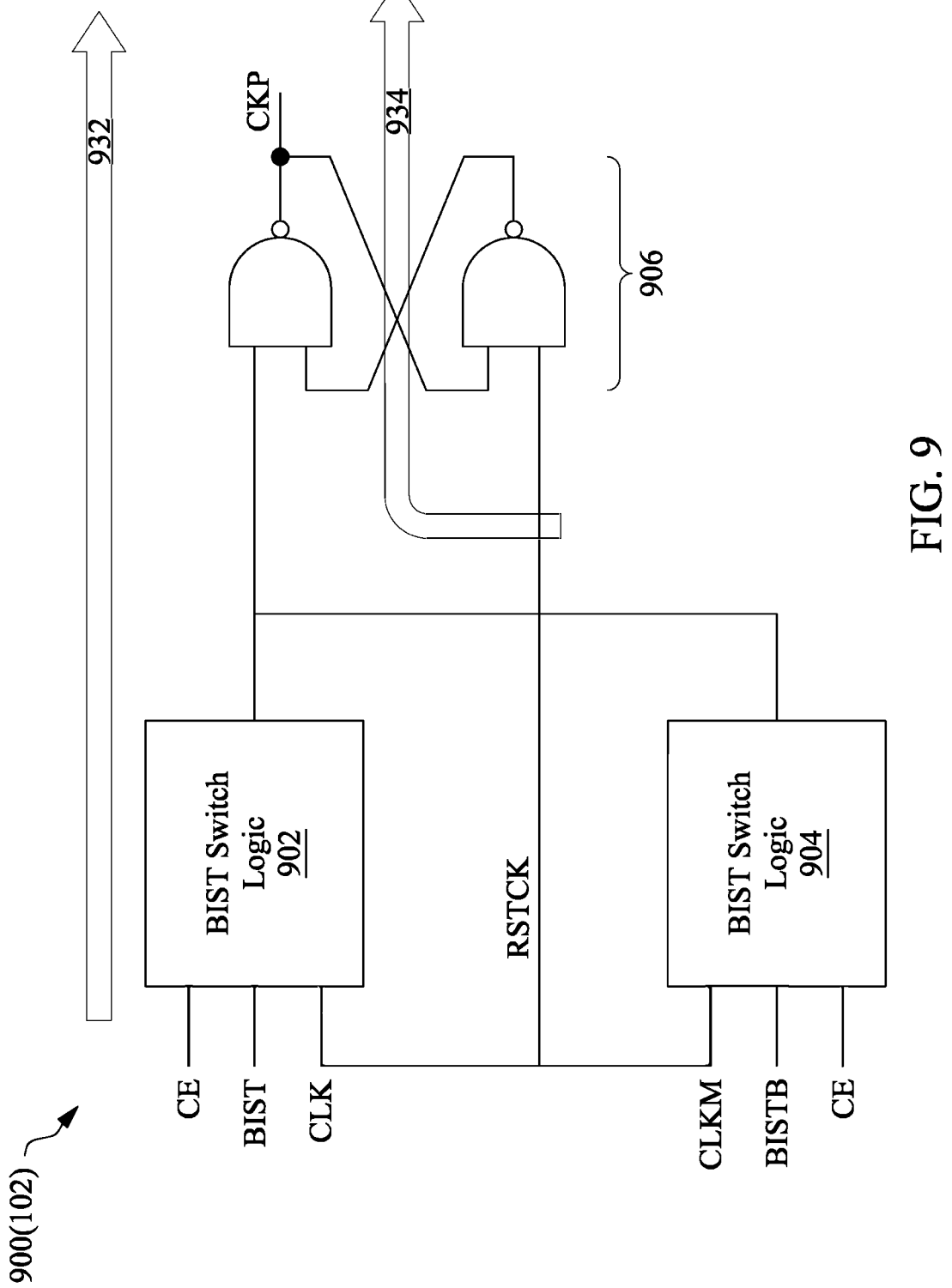
FIG. 9 illustrates a schematic diagram of yet another clock generation circuit of the memory device of FIG. 1, in accordance with some embodiments.

FIG. 9 illustrates a schematic diagram of a third implementation of the clock generation circuit 102 of FIG. 1, in accordance with various embodiments. Hereinafter, the clock generation circuit shown in FIG. 9 is referred to as "clock generation circuit 900." In brief overview, the clock generation circuit 900 includes a first BIST switch logic circuit 902, a second BIST switch logic circuit 904, and a latch circuit (e.g., an RS-latch) 906. The first BIST switch logic circuit 902 is configured to directly receive the first clock signal CLK and the control signal BIST and the second BIST switch logic circuit 904 is configured to directly receive the second clock signal CLKM and the logic inverse of the control signal BISTB, so as to select one of the first clock signal CLK or second clock signal CLKM as the clock pulse signal CKP.

In some embodiments, the first BIST switch logic circuit 902 is activated and the second BIST switch logic circuit 904 is deactivated, when the control signal BIST is at logic low and the control signal BISTB is at logic high (e.g., the normal operation mode); and the second BIST switch logic circuit 904 is activated and the first BIST switch logic circuit 902 is deactivated, when the control signal BIST is at logic high and the control signal BISTB is at logic low (e.g., the BIST mode). When at the normal operation mode, a first conduction path 932 can be intervally or periodically formed to output the first clock signal CLK as the clock pulse signal CKP. When at the BIST mode, a second conduction path 934 can be intervally or periodically formed to output the second clock signal CLKM as the clock pulse signal CKP. The first and second BIST switch logic circuits of FIG. 9 may include any of the first/second BIST switch logic circuit discussed above in FIG. 4-8. For example, the first BIST switch logic circuit 902 may include the transistors 402 and 412 connected to each other as shown in FIG. 4, and the second BIST switch logic circuit 904 may include the transistors 404 and 414 connected to each other as shown in FIG. 4.

In some embodiments, the clock generation (CKG) circuit 102 (FIG. 1) can generate the internal clock pulse signal CKP to drive or otherwise operate the following functional circuits, e.g., the control circuit 104, the driver circuit 106, the array 108, and the I/O circuit 110, based on more than two clock signals. For example, the CKG circuit 102 can receive three clock signals, CLK, CLKM, CLKN, in which the clock signal CLK is utilized for the memory device 100 to operate under the normal operation mode, the clock signal CLKM is utilized for the memory device 100 to operate under a first BIST mode, and the clock signal CLKN is utilized for the memory device 100 to operate under a second BIST mode. Even with such clock signal sources, the CKG circuit 102 can be implemented as any of the examples discussed above.

Figure 10:
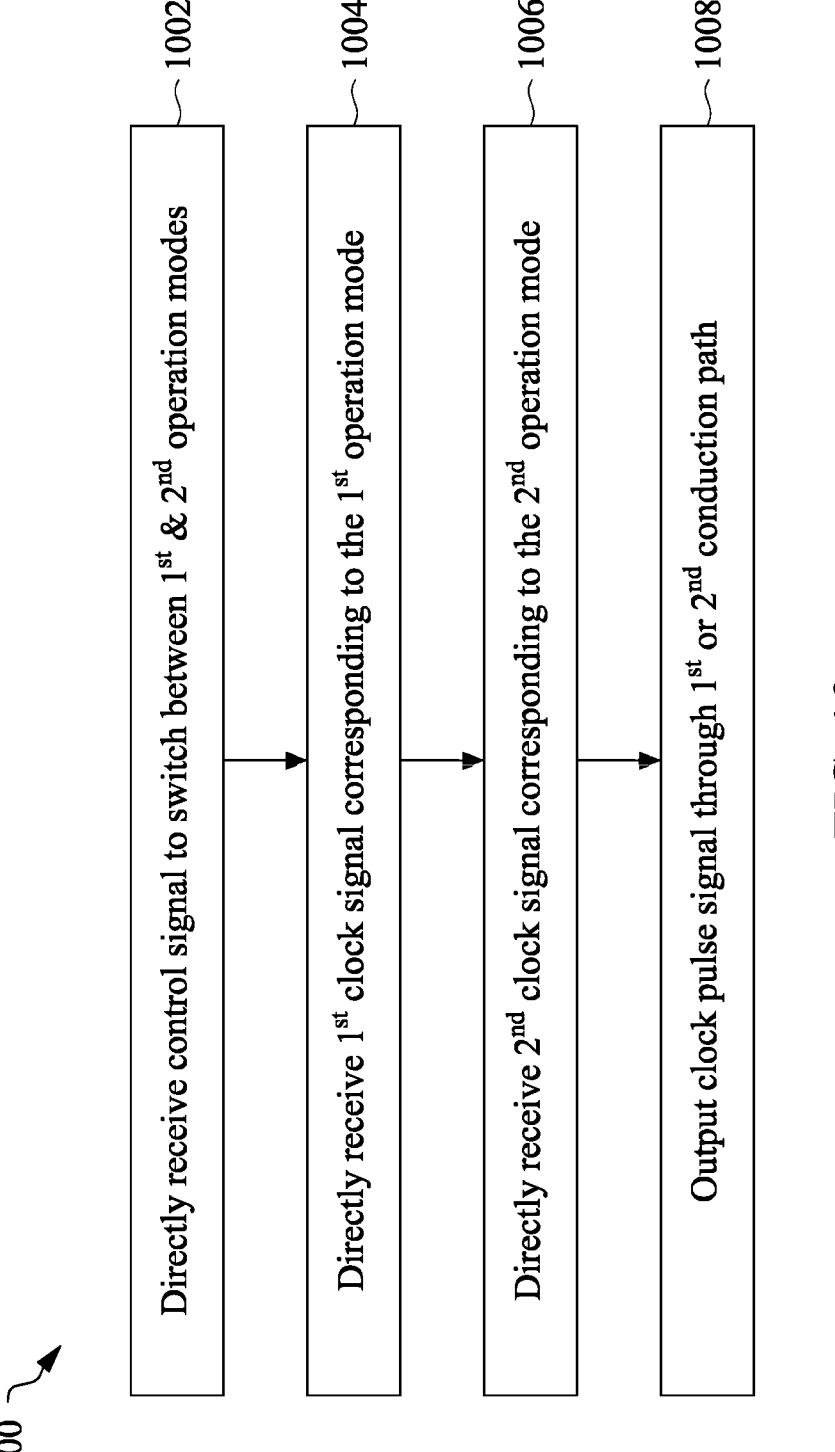
FIG. 10 is an example flow chart of a method for operating a memory device, in accordance with some embodiments.

FIG. 10 illustrates a flow chart of an example method 1000 for operating a memory device or circuit, in accordance with various embodiments. The method 1000 may be utilized to operate the memory device 100 (or the CKG circuit 102) of FIG. 1, and thus, discussion of the operations of the method 1000 may be referred to one or more components discussed above in FIGS. 1-9. It is noted that the method 1000 is merely an example and is not intended to limit the present disclosure. Accordingly, it is understood that additional operations may be provided before, during, and after the method 1000 of FIG. 10, and that some other operations may only be briefly described herein.

The method 1000 starts with operation 1002 of directly receiving, at a first input of a clock generation circuit, a control signal to switch a corresponding memory circuit between a first operation mode and a second operation mode. Using the clock generation circuit 102 of FIG. 1 as a representative example, the clock generation circuit 102 receives the control signal BIST at its first input (e.g., input 115 of the memory device 100). The control signal BIST can indicate whether the corresponding memory device 100 is configured to operate under a normal operation mode or a BIST mode. For example, when the control signal BIST is received at logic low, the memory device 100 is configured to operate under the normal operation mode; and when the control signal BIST is received at logic high, the memory device 100 is configured to operate under the BIST mode.

The method 1000 proceeds to operation 1004 of directly receiving, at a second input of the clock generation circuit, a first clock signal corresponding to the first operation mode. Continuing with the above example, the clock generation circuit 102 receives the first clock signal CLK at its second input (e.g., input 111 of the memory device 100). The first clock signal CLK may correspond to the normal operation mode. For example, when the control signal BIST is received at logic low, the first clock signal CLK may be received as toggling between logic high and low with a first frequency. In some embodiments, when the first clock signal CLK is received as toggling, the second clock signal CLKM may remain at logic low.

The method 1000 proceeds to operation 1006 of directly receiving, at a third input of the clock generation circuit, a second clock signal corresponding to the second operation mode. Continuing with the above example, the clock generation circuit 102 receives the second clock signal CLKM at its third input (e.g., input 113 of the memory device 100). The second clock signal CLKM may correspond to the BIST mode. For example, when the control signal BIST is received at logic high, the second clock signal CLKM may be received as toggling between logic high and low with a second frequency. In some embodiments, when the second clock signal CLKM is received as toggling, the first clock signal CLK may remain at logic low.

The method 1000 proceeds to operation 1008 of outputting, at an output of the clock generation circuit, a clock pulse signal through a first conduction path or a second conduction path. Continuing with the above example, further in conjunction with the clock generation circuit 200 of FIG. 2, the clock generation circuit 200 outputs the clock pulse signal CKP at its output through the first conduction path 232 or second conduction path 234. According to various embodiments of the present disclosure, either the first conduction path 232 or second conduction path 234 has a number of gate delays that is equal to or less than 2. Further, either the first conduction path 232 or second conduction path 234 is formed based on a combination of a clock enable signal (CKEN) and the control signal BIST/BISTB. Continuing with the above example, further in conjunction with the clock generation circuit 300 of FIG. 3, the clock generation circuit 300 outputs the clock pulse signal CKP at its output through the first conduction path 332 or second conduction path 334. According to various embodiments of the present disclosure, either the first conduction path 332 or second conduction path 334 has a number of gate delays that is equal to or less than 2. Further, either the first conduction path 332 or second conduction path 334 is formed based on a combination of the clock enable signal CKEN and the control signal BIST/BISTB. In some embodiments, the clock enable signal CKEN may be configured as toggling with the first or second clock signal CLK/CLKM, but with a third frequency lower than the first or second frequency. As such, the first clock signal CLK or the second clock signal CLKM can be selectively outputted as the clock pulse signal CKP with a lower frequency.

In one aspect of the present disclosure, an integrated circuit is disclosed. The integrated circuit includes one or more functional circuits, and a clock generation circuit operatively coupled to the one or more functional circuits. The clock generation circuit is configured to: receive a control signal to switch the one or more functional circuits between a first operation mode and a second operation mode; receive a first clock signal and a second clock signal corresponding to the first operation mode and the second operation mode, respectively; and output, to the one or more functional circuits, a clock pulse signal based on either the first clock signal or the second clock signal. The clock generation circuit is configured to generate either a first conduction path to output the clock pulse signal or a second conduction path to output the clock pulse signal. Each of the first and second conduction paths includes a predefined number of gate delays.

In another aspect of the present disclosure, a circuit is disclosed. The circuit includes a clock generation circuit configured to: directly receive, at a first input of the clock generation circuit, a control signal to switch a corresponding memory circuit between a first operation mode and a second operation mode; directly receive, at a second input of the clock generation circuit, a first clock signal corresponding to the first operation mode; directly receive, at a third input of the clock generation circuit, a second clock signal corresponding to the second operation mode; and output, at an output of the clock generation circuit, a clock pulse signal through a first conduction path or a second conduction path. The first conduction path extends from the second input to the output, and the second conduction path extends from the third input to the output, and wherein the first and second conduction paths each have a number of gate delays that is equal to or less than 2.

In yet another aspect of the present disclosure, a method for operating a memory circuit is disclosed. The method includes: directly receiving, at a first input of a clock generation circuit, a control signal to switch a corresponding memory circuit between a first operation mode and a second operation mode; directly receiving, at a second input of the clock generation circuit, a first clock signal corresponding to the first operation mode; directly receiving, at a third input of the clock generation circuit, a second clock signal corresponding to the second operation mode; outputting, at an output of the clock generation circuit, a clock pulse signal through a first conduction path or a second conduction path. The first conduction path extends from the second input to the output, and the second conduction path extends from the third input to the output. The first and second conduction paths each have a number of gate delays that is equal to or less than 2.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit, comprising:
one or more functional circuits; and
a clock generation circuit operatively coupled to the one or more functional circuits and configured to:
directly receive a control signal to switch the one or more functional circuits between a first operation mode and a second operation mode, wherein the second operation mode is a built-in self-test mode;
directly receive a first clock signal and a second clock signal corresponding to the first operation mode and the second operation mode, respectively;
generate at least one of a first conduction path according to the first clock signal or a second conduction path according to the second clock signal, wherein each of the first and second conduction paths includes a predefined number of gate delays that is equal to or less than 2; and
output, to the one or more functional circuits via at least one of the first conductive path or the second conductive path formed through at least one transistor and an inverter, a clock pulse signal based on at least one of the first clock signal or the second clock signal.

2. The integrated circuit of claim 1, wherein the one or more functional circuits include a decoder circuit, a word line driver circuit, a memory array, an input/output circuit, or combinations thereof.

3. The integrated circuit of claim 1, wherein the clock generation circuit comprises:

a first switch logic circuit configured to directly receive the first clock signal and a logic inverse of the control signal;

a second switch logic circuit configured to directly receive the second clock signal and the control signal; and the inverter operatively coupled to the first switch logic circuit and second switch logic circuit, and configured to output the clock pulse signal.

4. The integrated circuit of claim 3, wherein, when the logic inverse of the control signal is asserted, the first conduction path is formed to travel through a first logic gate of the first switch logic circuit and the inverter, and wherein, when the control signal is asserted, the second conduction path is formed to travel through a second logic gate of the second switch logic circuit and the inverter.

5. The integrated circuit of claim 4, wherein the first logic gate and the second logic gate are each a transistor.

6. The integrated circuit of claim 4, wherein the first logic gate and the second logic gate are each a transmission gate.

7. The integrated circuit of claim 1, wherein the clock generation circuit comprises:

a first switch logic circuit configured to receive the control signal and a clock enable signal, and generate a first version of the clock enable signal;

a second switch logic circuit configured to receive a logic inverse of the control signal and the clock enable signal, and generate a second version of the clock enable signal;

a first transistor configured to directly receive the first clock signal;

a second transistor configured to directly receive the second clock signal; and the inverter operatively coupled to the first transistor and second transistor, and configured to output the clock pulse signal.

8. The integrated circuit of claim 7, wherein, when the first version of the clock enable signal is asserted, the first conduction path is formed to travel through the first transistor and the inverter, and wherein, when the second version of the clock enable signal is asserted, the second conduction path is formed to travel through the second transistor and the inverter.

9. The integrated circuit of claim 7, wherein the first switch logic circuit and the second switch logic circuit each include a NOR gate receiving a logic inverse of the clock enable signal.

10. The integrated circuit of claim 7, wherein the first switch logic circuit and the second switch logic circuit each include another inverter coupling between the clock enable signal and ground.

11. The integrated circuit of claim 7, wherein the first switch logic circuit and the second switch logic circuit each include a transmission gate receiving the clock enable signal.

12. A memory circuit, comprising:

a clock generation circuit configured to:

directly receive, at a first input of the clock generation circuit, a control signal to switch a corresponding memory circuit between a first operation mode and a second operation mode;

directly receive, at a second input of the clock generation circuit, a first clock signal corresponding to the first operation mode;

directly receive, at a third input of the clock generation circuit, a second clock signal corresponding to the second operation mode;

form, through at least one transistor and an inverter, at least one of a first conductive path according to the first clock signal or a second conductive path according to the second clock signal, wherein the first conduction path extends from the second input to an output of the clock generation circuit and the second conduction path extends from the third input to the output, and wherein the first and second conduction paths each have a number of gate delays that is equal to or less than 2; and output, at the output of the clock generation circuit, a clock pulse signal through the at least one transistor and the inverter of at least one of the first conduction path or the second conduction path.

13. The memory circuit of claim 12, wherein, between the second input to the output, the first conduction path extends through a first transistor and an inverter of the clock generation circuit, wherein, between the third input to the output, the second conduction path extends through a second transistor and the inverter of the clock generation circuit, and wherein the first transistor has a first gate configured to receive the first clock signal, and the second transistor has a second gate configured to receives the second clock signal.

14. The memory circuit of claim 13, wherein the first conduction path or second conduction path is formed based on a combination of a clock enable signal and the control signal.

15. The memory circuit of claim 12, wherein, between the second input to the output, the first conduction path extends through a first transmission gate and an inverter of the clock generation circuit, wherein, between the third input to the output, the second conduction path extends through a second transmission gate and the inverter of the clock generation circuit, and wherein the first transmission gate configured to receive the first clock signal, and the second transmission gate configured to receive the second clock signal.

16. The memory circuit of claim 15, wherein the first conduction path or second conduction path is formed based on a combination of a clock enable signal and the control signal.

17. The memory circuit of claim 12, wherein the first operation mode includes a read/write operation of the corresponding memory circuit, and the second operation mode includes a built-in self-test mode of the corresponding memory circuit.

18. A method for operating a memory circuit, comprising:

receiving, directly at a first input of a clock generation circuit, a control signal to switch a corresponding memory circuit between a first operation mode and a second operation mode, wherein the first operation mode includes a read/write operation of the corresponding memory circuit, and the second operation mode includes a built-in self-test mode of the corresponding memory circuit;

receiving, directly at a second input of the clock generation circuit, a first clock signal corresponding to the first operation mode;

receiving, directly at a third input of the clock generation circuit, a second clock signal corresponding to the second operation mode;

generating, through at least one transistor and an inverter, at least one of a first conduction path according to the first clock signal or a second conduction path according to the second clock signal, wherein the first conduction path extends from the second input to an output of the clock generation circuit and the second conduction path extends from the third input to the output, and wherein the first and second conduction paths each have a predefined number of gate delays that is equal to or less than 2; and outputting, at the output of the clock generation circuit, a clock pulse signal through the at least one transistor and the inverter of at least one of the first conduction path or the second conduction path.

19. The method of claim 18, wherein at least one of the first conduction path or the second conduction path is formed based on a combination of a clock enable signal and the control signal.

20. The method of claim 18, wherein outputting the clock pulse signal comprises:

outputting, at the output of the clock generation circuit to one or more functional circuits, the clock pulse signal through the at least one transistor and the inverter of at least one of the first conduction path or the second conduction path, wherein the one or more functional circuits comprises a decoder circuit, a word line driver circuit, a memory array, an input/output circuit, or combinations thereof.

\* \* \* \* \*